United States Patent [19]

Tero et al.

[11] Patent Number: 5,023,481
[45] Date of Patent: Jun. 11, 1991

[54] TOTEM POLE CIRCUIT WITH ADDITIONAL DIODE COUPLING

[75] Inventors: John Tero, Saratoga; Shaoan Chin, Cupertino; Bing F. Ma, Sunnyvale, all of Calif.

[73] Assignee: North American Philips Corporation, New York, N.Y.

[21] Appl. No.: 457,457

[22] Filed: Dec. 27, 1989

[51] Int. Cl.⁵ .............. H03K 19/088; H03K 19/084; H03K 19/013; H03K 17/04
[52] U.S. Cl. ........................... 307/456; 307/458; 307/443; 307/446
[58] Field of Search ............ 307/456, 457, 458, 443, 307/270, 475, 446, 542

[56] References Cited

U.S. PATENT DOCUMENTS

| | | | |
|---|---|---|---|
| 4,306,159 | 12/1981 | Wiedmann | 307/456 X |
| 4,467,223 | 8/1984 | Neely | 307/456 X |
| 4,521,699 | 6/1985 | Wilson | 307/456 |
| 4,562,364 | 12/1985 | Tanizawa | 307/456 X |
| 4,697,103 | 9/1987 | Ferris et al. | 307/456 |
| 4,698,525 | 10/1987 | Tavana et al. | 307/456 |
| 4,704,548 | 11/1987 | Strong et al. | 307/456 |
| 4,855,622 | 8/1989 | Johnson | 307/456 |
| 4,897,566 | 1/1990 | Kitora et al. | 307/456 |

Primary Examiner—Stanley D. Miller
Assistant Examiner—David R. Bertelson
Attorney, Agent, or Firm—David R. Treacy

[57] ABSTRACT

An output circuit having the output taken between a pull-up output transistor and a pull-down output transistor connected in series for conducting current alternatively. Separate pull-up and pull-down driver circuits are controlled by a common input signal. The pull-down driver circuit is supplied by a pull-down current source, and a diode is connected from the point between the pull-down driver transistor and pull-down current source to the output node. The effect of a large node capacitance is reduced by the diode, which conducts current from the pull-down current source to any output load capacitance to raise the output voltage more rapidly when the pull-down driver circuit is cut off.

10 Claims, 1 Drawing Sheet

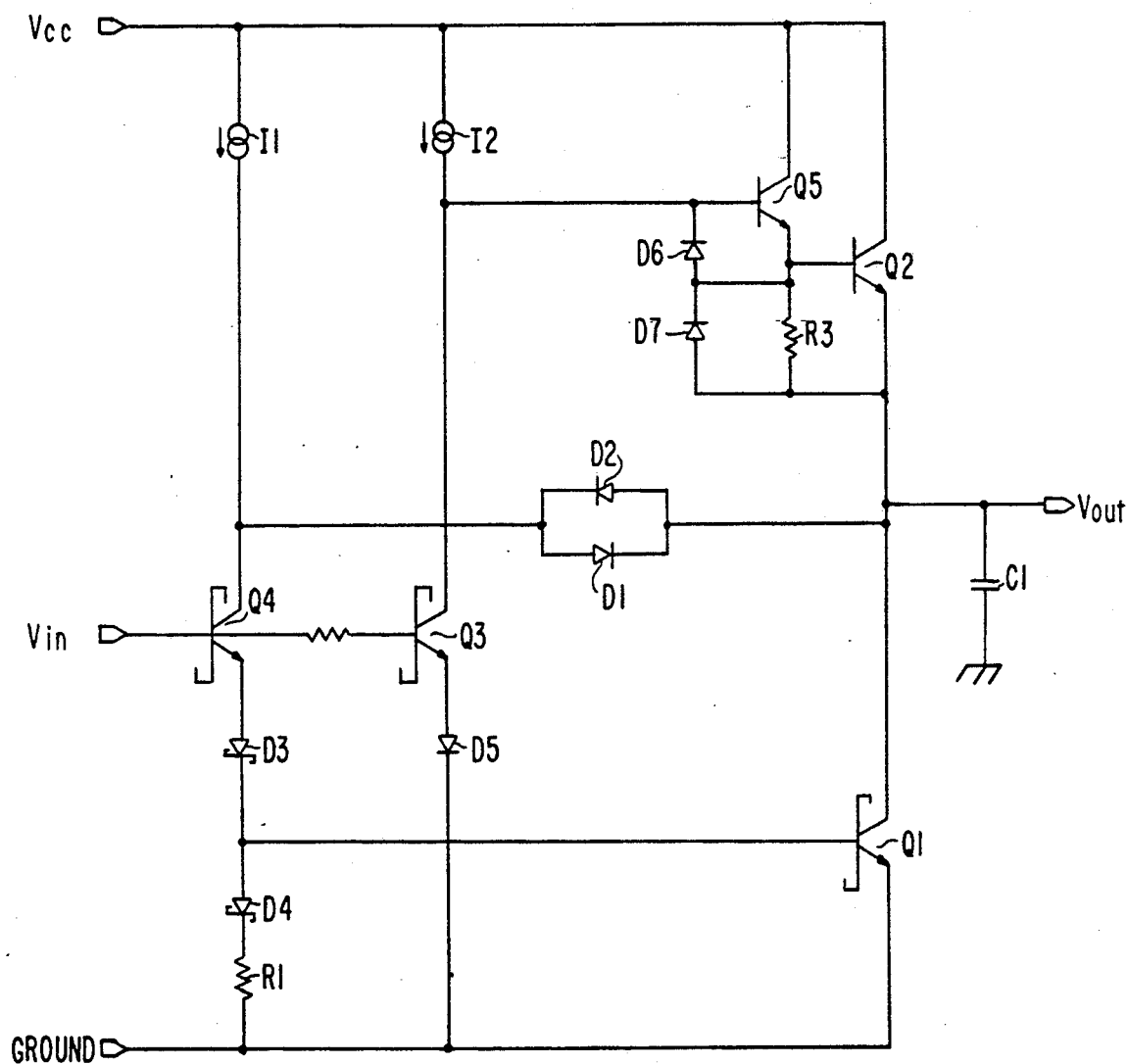

TOTEM POLE CIRCUIT WITH ADDITIONAL DIODE COUPLING

BACKGROUND OF THE INVENTION

1. Field of the Invention:

The invention relates to a switchable output circuit, having an output taken from a node between output transistors connected in series for conducting current alternatively, of the type commonly called a totem pole circuit; and more particularly to the coupling between the output transistors of such a circuit and the driver circuits.

Circuits of this type will typically have the output transistors connected in series between two power supply connections, one of which may be ground; or the two supply connections may be at different levels with respect to ground, for example, equal and opposite polarity voltages. Control signals for the output transistors are frequently provided by two different driver circuits, one for each transistor. Where, during normal operation, the output transistors are intended to conduct alternatively, in a switching mode with each being either turned full on or full off, it is convenient to refer to one driver circuit as a pull-up driver circuit where this turns on the output transistor connected to the higher voltage power supply connection; and the other driver circuit may be called a pull-down driver circuit, whose function is to turn on the transistor connected between the output and the lower potential power supply connection.

In designing such circuits, a point of common concern is "cross-conduction" which refers to the situation in which one output transistor is turned on before the other output transistor has turned off. Such cross-conduction has the effect of drawing a high momentary peak current from the power supply, which may be physically damaging to one or more parts of the circuit, or be a source of interfering electrical noise for other parts of the circuitry.

2. Description of the Prior Art

U.S. Pat. No. 4,855,622 discloses a transistor switching circuit having a controlled rate of change of the driver voltages, so that when the input signal changes in a direction to cause switching of the output, the driver circuit which is turning off one output transistor has a controlled change of driving voltage which is substantially completed before the other driver circuit begins such a change of driving voltage. As shown in FIG. 3 of that patent, this control of the pull-down driver circuit is provided by a capacitor C2 connected between the output node of the output circuit and the base connection of the driver transistor Q5.

In the circuit taught in this U.S. patent, the effect of the capacitor C2 is to slow down the switching rate of the lower driver, to prevent its turning on prematurely.

SUMMARY OF THE INVENTION

An object of the invention is to provide a circuit having a fast controlled rate of switching of the output transistors, particularly suitable for use when a load impedance which is highly capacitive is connected to the output node.

Another object of the invention is to eliminate the possibility of cross-conduction current during switching transients when driving a heavy capacitive load.

According to the invention, in a switchable output circuit as described above, a diode is connected between the output node and the current path which provides current to the pull-down driver circuit, the diode having the same polarity toward the output node as the polarity of the output transistor fed from the higher power supply reference voltage (the pull-up transistor).

This diode aids the circuit dynamic response, to ensure that there is no cross-conduction when the input voltage swings in the direction for turning off the output transistor controlled by the pull-down driver, and turning on the pull-up output transistor. Current flow from the pull-down driver current source through the diode raises the output voltage as the pull-down transistor is being turned off, even when there is a high capacitive load, thus delaying the turn-on of the pull-up output transistor.

In a preferred embodiment, where the transistors used are bipolar transistors, the pull-up driver includes a third transistor having a single diode connected between its emitter and the lower (ground) reference voltage. The collector of the third transistor is connected to the control electrode of the pull-up output transistor. To provide a clearly different switching threshold between the two driving circuits, the pull-down driver circuit has a similar fourth transistor having two diodes in series between its emitter and ground, with the control voltage for the pull-down output transistor being taken from the node between those two diodes. The collector of the fourth transistor is connected to the pull-down current source and to the diode which connects to the output node.

Preferably, in this embodiment, the pull-down output transistor is a first Schottky transistor; the third and fourth transistors are Schottky transistors; and the diode between the fourth transistor emitter and ground are Schottky diodes. This configuration typically provides approximately half a volt differential between the turn-on of the two driver transistors, or their turn-off.

In another aspect of the invention, the diode described above is one diode of an opposite polarity pair connected in parallel between the output node and the pull-down driver current path. In this embodiment, the other diode of the pair provides faster discharging of a capacitive output load when the pull-up output transistor is being turned off and the pull-down transistor is to be turned on. During this transition, the pull-down current source may not provide sufficient initial base drive current through the pull-down driver transistor and one of the Schottky diode pair to the control electrode of the pull-down output transistor. In that circumstance, current will flow from the output node through this other diode during that portion of the switching transient to add to the total current flow through the pull-down driver transistor.

These and other aspects of the invention will be described more fully by reference to the accompanying drawing and the detailed description given below.

BRIEF DESCRIPTION OF THE DRAWING

The sole figure of the drawing is a simplified schematic diagram of an output circuit and drivers in accordance with the invention.

DESCRIPTION OF THE PREFERRED EMBODIMENT

The embodiment shown in the sole drawing figure is an optimized circuit for current integrated circuit manufacturing practice, using all NPN transistors, single ended signals with power provided between a positive voltage supply and ground, and ordinary junction and Schottky devices selected for optimized performance.

In this circuit, power is provided between a ground or first reference potential and a positive second reference potential $V_{cc}$. A pull-down Schottky output transistor Q1 as its emitter connected to ground and its collector connected to the output node $V_{out}$. The pull-up transistor as its emitter likewise connected to the output node, and collector connected to the supply $V_{cc}$. Two driver circuits are used, a pull-up driver circuit including a Schottky transistor Q3, and a pull-down driver circuit including a Schottky transistor Q4. Current to the pull-down driver circuit is supplied by a current source I1 connected to the collector of Q4 and also to the anode of a first diode D1 whose cathode is connected to the output node $V_{out}$. Current for the pull-up driver is provided by a current source I2 connected to the collector of Q3. Thus the circuit may be considered as having four principal current paths which are turned on at one time or another: A first path through transistor Q1, a second path through transistor Q2, a third path through current source I2 and Q3 and a fourth path through current source I1 and Q4.

The pull-down driver circuit includes Schottky diodes D3 and D4 in series with a resistor R1 between the emitter of Q4 and ground. The base of output transistor Q1 is connected to the node between the diodes D3 and D4. The control voltage $V_{in}$ is applied directly to the base of Q4, R2 to the base of pull-up driver transistor Q3. A conventional diode D5 is connected between the emitter of Q3 and ground. This arrangement of driver circuits assures that, when the input voltage is rising from a low value to a high value, Q3 turns on before Q4. A pair of parallel connected, opposite polarity diodes D1 and D2 are connected between the output node and the fourth current path at the collector of Q4. As will be explained in more detail later, these diodes assure that capacitance in an output load can be charged or discharged quickly during switching trangients to eliminate the possibility of cross-conduction.

Preferably, the pull-up output transistor is part of a Darlington connection including a transistor Q5 having its emitter connected to the base of Q2, and its base connected to the collector of Q3. Diodes D6 and D7 are connected across the base emitter junctions of diodes Q5 and Q2, respectively, and a resistor R3 (for what function?) is connected in parallel with D7.

The normal operation of this circuit, assuming that $V_{be} = 0.7v$, the forward voltage of a Schottky diode is 0.5v, $V_{in}$ may initially have a low value of 0.2v, a $V_{out}$ is at a high initial value of typically 10v, is as follows: When $V_{in}$ increases from the initial low value, as $V_{in} = 1.4v$ (0.7v $V_{be}$ of Q3 + 0.7v for D5) Q3 turns on, turning off Q5 and Q2. As $V_{in}$ continues to rise, when it passes 1.9v (0.7v $V_{be}$ of Q4 + 0.5v for each Schottky diode) Q4 turns on, and the voltage across D4 plus that due to current through R1 is sufficient to turn on Q1. During this switching operation, diode D4 aids in rapid transients of any load capacitance C1 by providing additional current through Q4 and D3 to add to the base drive current for Q1, thereby compensating for any Miller capacitance between the collector and base of Q1 which would tend to oppose turn-on of the transistor.

When $V_{in}$ is decreasing so as to cause the opposite switching, Q4 is turned off as $V_{in}$ passes 1.9v, thereby turning off Q1. As $V_{in}$ continues to decrease, and passes 1.4v, Q3 turns off thereby permitting the base voltage on Q5 to rise so that Q2 is turned on. During this switching sequence, the diode D1 carries a portion of the pull-down current from source I1 to charge any load capacitance C1 more rapidly, thereby raising the emitter voltage of transistor Q2 and delaying turn on of that transistor until after Q1 is fully turned off. Thus the diode D1 functions to prevent cross-conduction during this switching.

Those of ordinary skill in the art will recognize that the principle of the invention can be applied equally to a circuit using pnp transistors, with appropriate changes in supply voltage polarity and the polarity of the diodes. At the cost of some additional circuit complexities, the same principal can be obtained in a circuit having transistors of both conductivity types, and it is also clear that the invention is applicable to field effect transistor circuits. Thus, it will be apparent that other changes and modifications may be made to the invention without departing from the spirit and scope of the invention as claimed.

We claim:

1. A switchable output circuit, having an output taken from a node between output transistors connected in series for conducting current alternatively, comprising:

first and second connections for supplying power to said circuit at respective first and second reference voltage levels, first output transistor means including a first output transistor, connected to provide a first current path between said first connection and said node, and having a first output control electrode; and second output transistor means including a second output transistor, connected to provide a second current path between said second connection and said node, and having a second output control electrode, a pull-up driver circuit connected to provide a third current path to said first connection, having a driver electrode connected to said second output control electrode, and a pull-up driver signal input connection, a pull-down current source, and a pull-down driver circuit connected to provide a fourth current path between said pull-down current source and said first connection, having a driver electrode connected to said first output control electrode, and a pull-down driver signal input connection, and a first diode connected between the output node and the fourth current path, said first diode being connected to the fourth current path between said pull-down current source and said pull-down driver circuit with a polarity chosen for conducting current toward said output node the same as current through said second current path, whereby said circuit can drive a highly capacitive load, connected to said output node, without cross conduction current through the output transistors during switching transients.

2. A circuit as claimed in claim 1, further comprising a second diode connected in parallel with said first diode, having a direction of conduction opposite to that of the first diode.

3. A circuit as claimed in claim 1, wherein said pull-up driver signal connection and said pull-down driver signal connection receive a common input signal, said pull-down driver being turned on by a first change in said common input signal for turning on said first output transistor means, said pull-up driver being turned on by a change in said common input signal in the same direction as said first change, for turning off said second output transistor means; and the pull-up and pull-down circuits being arranged such that, when one output transistor means is turned on, a change in said common input signal, in a direction which will turn on the other output transistor means, first turns off said one output transistor means.

4. A switchable output circuit, having an output taken from a node between output transistors connected in series for conducting current alternatively, comprising first and second connections for supplying power to said circuit at respective first and second reference voltage levels, a first bipolar output transistor, connected to provide a first current path between said first connection and said node, and having a first output base electrode; and a second bipolar output transistor, connected to provide a second current path between said second connection and said node, and having a second output base electrode, said output transistors being of a same conductivity type, a pull-up driver circuit connected to provide a third current path to said first connection, having a bipolar third transistor and means for connecting its collector to said second output base electrode, and a pull-up driver signal input connection, a pull-down current source, and a pull-down driver circuit connected to provide a fourth current path between said pull-down current source and said first connection, having a bipolar fourth transistor and means for connecting its emitter to said first output control electrode, and a pull-down driver signal input connection; said third and fourth transistors being a same conductivity type as said output transistors, and a first diode connected between the output node and the fourth current path, said first diode being connected to the fourth current path between said pull-down current source and said pull-down driver circuit with a polarity toward said output node the same as current through said second current path, whereby said circuit can drive a highly capacitive load, connected to said output node, without cross conduction current through the output transistors during switching transients.

5. A circuit as claimed in claim 4, further comprising a second diode connected in parallel with said first diode, having a direction of conduction opposite to that of the first diode.

6. A circuit as claimed in claim 4, comprising a pull-up current source of a same polarity as said pull-down current source, connected to the collector of said third transistor, wherein said means for connecting its collector to said second output transistor comprises a fifth transistor forming a Darlington pair with said second transistor.

7. A circuit as claimed in claim 6, wherein said first transistor is a Schottky transistor; the pull-down driver circuit includes two Schottky diodes in series between the fourth transistor emitter and the first connection, the base of the first transistor being connected to a node between the two Schottky diodes, a second diode is connected in parallel with said first diode, having a direction of conduction opposite to that of the first diode, and a third diode is connected between the emitter of the third transistor and the first connection.

8. A circuit as claimed in claim 7, further comprising a second diode connected in parallel with said first diode, diode.

9. A switchable output circuit, having an output taken from a node between two NPN output transistors connected in series for conducting current alternatively, comprising a ground connection and a second connection for supplying power to said circuit with respect to ground, a first NPN output transistor, connected to provide a first current path between said ground and said node, and having a first output base electrode; and a second NPN output transistor, connected to provide a second current path between said second connection and said node, and having a second output base electrode, a pull-up driver circuit connected to provide a third current path from said second connection to ground, having an NPN third transistor and means for connecting its collector to said second output base electrode, and a pull-up driver signal input connection, a pull-down current source, and a pull-down driver circuit connected to provide a fourth current path between said pull-down current source and ground, having an NPN fourth transistor and means for connecting its emitter to said first output control electrode, and a pull-down driver signal input connection, and a pair of opposite polarity diodes connected between the output node and the collector of the fourth transistor, whereby said circuit can drive a highly capacitive load, connected to said output node, without cross conduction current through the output transistors during switching transients.

10. A circuit as claimed in claim 9, characterized in that:

said diodes are diode-connected NPN transistors, said first, third and fourth transistors are Schottky transistors, the pull-down driver circuit includes two Schottky diodes in series between the fourth transistor emitter and ground, the base of the first transistor being connected to a node between the two Schottky diodes, and a third diode is connected between the emitter of the third transistor and ground.

* * * * *